(12) United States Patent
Elkouby et al.

(10) Patent No.: US 7,887,935 B2
(45) Date of Patent: Feb. 15, 2011

(54) CUTTING INSERT HAVING CERAMIC COATING

(75) Inventors: Marcel Elkouby, Haifa (IL); Gadi Greenman, Haifa (IL)

(73) Assignee: Iscar, Ltd., Tefen (IL)

( * ) Notice: Subject to any disclaimer, the term of this patent is extended or adjusted under 35 U.S.C. 154(b) by 408 days.

(21) Appl. No.: 12/041,843

(22) Filed: Mar. 4, 2008

(65) Prior Publication Data

US 2008/0240876 A1 Oct. 2, 2008

(30) Foreign Application Priority Data

Apr. 1, 2007 (IL) .................................... 182344

(51) Int. Cl.
*B32B 9/00* (2006.01)
(52) U.S. Cl. ...................... 428/697; 51/307; 51/309; 427/419.1; 427/419.2; 427/419.7; 428/216; 428/336; 428/698; 428/699; 428/701; 428/702
(58) Field of Classification Search ................ 51/307, 51/309; 428/216, 336, 697, 698, 699, 701, 428/702; 427/419.1, 419.2, 419.7
See application file for complete search history.

(56) References Cited

U.S. PATENT DOCUMENTS

| | | | | |
|---|---|---|---|---|
| 4,746,563 | A * | 5/1988 | Nakano et al. ............... | 51/309 |
| 5,576,093 | A | 11/1996 | Yoshimura et al. | |
| 5,700,569 | A * | 12/1997 | Ruppi ........................... | 51/307 |
| 6,071,601 | A * | 6/2000 | Oshika et al. ................ | 428/702 |
| 6,284,356 | B1 * | 9/2001 | Kiriyama ...................... | 428/697 |
| 6,333,099 | B1 * | 12/2001 | Strondl et al. ................ | 428/701 |
| 6,436,519 | B2 * | 8/2002 | Holzschuh ................... | 428/336 |
| 6,689,450 | B2 | 2/2004 | Ruppi | |
| 6,733,874 | B2 * | 5/2004 | Ueda et al. ................... | 428/699 |
| 7,153,562 | B2 * | 12/2006 | Rodmar et al. .............. | 428/216 |
| 2002/0176755 | A1 | 11/2002 | Ruppi | |

(Continued)

FOREIGN PATENT DOCUMENTS

EP          0162656          11/1985

(Continued)

OTHER PUBLICATIONS

Ruppi et al., "Nanoindentation hardness, texture and microstructure of α-$Al_2O_3$ and κ-$Al_2O_3$ coatings", Elsevier, ScienceDirect (www.sciencedirect.com), No. 516, 2008, pp. 5959-5966.

(Continued)

*Primary Examiner*—Archene Turner
(74) *Attorney, Agent, or Firm*—Womble Carlyle (57) ABSTRACT

A cutting tool insert has a multilayer ceramic coating. The multilayer ceramic coating is a stratified structure of alternating sub layers of an oxide material and interfacial layers of a second material having good adhesion with the oxide material. The ceramic coating is deposited by chemical vapor deposition; each subsequently deposited interfacial layer serving to terminate a previously deposited oxide material sub layer and to serve as a surface for deposition of a subsequent oxide material sub layer. The second material is a solid solution of at least one element of the oxide material in a hard material.

25 Claims, 4 Drawing Sheets

U.S. PATENT DOCUMENTS

2008/0050614 A1* 2/2008 Holzschuh ............... 428/698

FOREIGN PATENT DOCUMENTS

| EP | 0 594 875 | 5/1994 |
| EP | 1 245 700 | 10/2002 |
| JP | 10310877 | 11/1998 |
| JP | 2004188575 | 7/2004 |
| WO | WO 2006/072288 | 7/2006 |

OTHER PUBLICATIONS

Andersson, "Controlling the Formation and Stability of Alumina Phases", Linköpings universitet, Inst. of Tech., 2005, 55 pgs.

Nable et al., "MOCVD of Aluminum Oxide Barrier Coating", Mat. Res. Soc. Symp. Proc., vol. 750, 2003, pp. Y5.29.1-Y5.29.6.

Ruppi et al., "Microstructure and deposition characteristics of $\kappa$-Al$_2$O$_3$", J. Phys. IV France, vol. 9, 1999, pp. Pr8-349-Pr8-355.

Prengel et al., "CVD coatings based on medium temperature CVD $\kappa$- and $\alpha$-Al$_2$O$_3$", Surface and Coatings Technology, vol. 68, No. 69, 1994, pp. 217-220.

Devi et al., "MOCVD of aluminium oxide films using aluminium $\beta$-diketonates as precursors", J. Phys. IV France, vol. 12, 2002, pp. Pr4-139-Pr4-Pr146.

Kyrylov et al., "Effect of ion irradiation during deposition on the structure of alumina thin films grown by plasma assisted chemical vapour deposition", Appl. Phys. A, vol. 80, 2005, pp. 1657-1660.

International Search Report No. PCT/IL2008/000301, dated Jul. 23, 2008, 4 pgs.

* cited by examiner

CUTTING INSERT HAVING CERAMIC COATING

FIELD OF THE INVENTION

The present invention is directed to improved coating systems, and particularly but not exclusively to novel thick coatings and methods of fabrication thereof, for applying to appropriate substrates to provide cutting tools, inserts and replaceable cutting heads having enhanced properties such as longer working life, for example.

BACKGROUND OF THE INVENTION

For machining metal work-pieces, by cutting, turning, milling, drilling and like, cutting tools are used. To ensure that chips are efficiently removed from the work-piece, whilst ensuring long working life of cutting tool, a cutting tool insert is required to be hard and tough.

Hardness however may be correlated with brittleness. Being both hard and tough, composite materials consisting of hard ceramic particles in a metal matrix are very popular choices for inserts. A number of such ceramic metal composites or cermets have been developed. The so called hard metals or cemented carbides, in particular, WC—Co, consisting of tungsten carbide grains in a cobalt matrix, are the materials of choice for fabrication of cutting tool inserts for many applications.

Inserts remove chips and shape the work-piece, but are, themselves, worn away in the process. The wear of cutting tool inserts takes place at their contact surfaces with the workpiece, and can generally be attributed to mechanical, chemical and thermal interaction with the workpiece.

The downtime of machine tools whilst replacing insert is generally an expensive operation. Much research is directed to improving the wear resistance of inserts by application of hard coatings. Hardness is a measure of resistance to plastic deformation, and there is a correlation between hardness and wear resistance. While coatings increase wear resistance, they are often susceptible to catastrophic failure modes such as peeling and the like.

Coatings may be formed on inserts by a range of coating technologies that are generally classified as PVD (physical vapor deposition) or CVD (chemical vapor deposition).

PVD gives very good properties. Coating is only line-of-sight. PVD coatings are characterized by compressive residual stresses from the deposition process. Because of the risk of coating failure by peeling as the coating thickness increases, PVD is generally limited to thin coatings.

CVD coatings are not to line-of-sight. Furthermore, deposition temperatures are typically rather higher than those of PVD technologies and this facilitates the development of a diffusion-induced interface between coating and substrate which allows good adhesion to be achieved. Indeed, good adhesion is one of the critical requirements for the coating of inserts.

Furthermore, there are some materials and material-substrate combinations that are only practical by one or other coating technique.

For more than 40 years, CVD (chemical vapor deposition) has been used for coating inserts, thereby improving their performance in machining. Coatings of TiN, TiC and TiC,N may be deposited onto appropriate substrates by reacting titanium tetrachloride with other gases, and removing the gaseous chlorides thus formed:

$TiCl_4+N_2+H_2 \rightarrow TiN+$ Chlorides and other gases.

$TiCl_4+CH_4+H_2 \rightarrow TiC+$ Chlorides and other gases.

$TiCl_4+N_2+CH_4+H_2 \rightarrow TiCN+$ Chlorides and other gases.

$Al_2O_3$ coatings may be produced in a similar manner:

$Al+HCl+H_2 \rightarrow AlCl_3+H_2;$ $AlCl_3+H_2+CO_2+H_2S \rightarrow Al_2O_3+$ Chlorides and other gases, where $H_2S$ serves as a catalyst; enhancing the deposition rate and thickness uniformity of the $Al_2O_3$ coating.

It will be appreciated that, over the years, other chemical vapor deposition routes have become available for deposition of TiN, TiC, TiCN and $Al_2O_3$, and the above routes using titanium chloride and aluminum chloride are given by way of non-limiting example, only.

Indeed, a wide variety of hard coatings, such as various carbides, nitrides, oxides, borides and mixtures thereof may be deposited by one or other of the various PVD and/or CVD techniques. In the machining of hard materials, such as cast iron, for example, high temperatures are generated. At such high temperatures, many coating materials, such as carbides and nitrides are reactive, and may interact with the workpiece and/or with the cooling fluids and air. $Al_2O_3$ (alumina) is both highly chemical resistant and very hard. Consequently, alumina is a popular coating material for increasing the life of inserts.

European Patent Number EP1245700 to Ruppi entitled "Enhanced $Al_2O_3$—Ti(C,N) Multi-Coating Deposited at Low Temperature" relates to a coated body of cemented carbide, cermet, ceramic and/or high speed steel used as a metal cutting tool and having a multi-layer of κ-$Al_2O_3$ and/or γ-$Al_2O_3$ optionally interspersed with layers of titanium carbonitride Ti(C,N) which can also be applied by MTCVD.

Other known multilayered coatings that comprise both Ti based layers and $Al_2O_3$ layers can be found in the following references:

| | | | |
|---|---|---|---|
| JP11269650A2 | JP2000119855A2 | JP2000107909A2 | JP03122280A2 |
| JP2000096235A2 | JP2000096234A2 | JP11347806A2 | JP11310878A2 |
| JP2002144109A2 | JP2001062604A2 | JP2000158208A2 | JP2000158207A2 |
| EP0594875A1 | JP59025970A2 | JP2005246596A2 | JP2004188577A2 |
| U.S. Pat. No. 6,689,450 | JP2004299023A2 | JP2004299021A2 | JP2004188576A2 |
| JP2004188575A2 | JP2000052130A2 | JP11254208A2 | JP11090737A2 |
| JP11000804A2 | JP10310878A2 | JP10310877A2 | |

Alumina exists in a number of forms. γ-alumina and κ-alumina are metastable phases. In a number of machining scenarios, such as interrupted turning on a lathe, and when turning without a coolant, for example, inserts coated with α-alumina has been found to perform better than those coated with γ-alumina or κ-alumina.

From the alumina phase diagram, at temperatures of above 1050° C. under standard pressure, γ-alumina and κ-alumina transpose into the stable α-alumina allotrope (corundum). Due to the poor heat dispersing properties of alumina and the high temperatures generated in machining, it is likely that the rake surface reaches 1050° C. in some cutting processes, particularly with dry machining, and, at the very high pressures experienced on the rake face of inserts, the phase transformation is likely to occur at lower temperatures. The recrystallization of the alumina surface of an insert during machining processes may lead to accelerated wear.

It is also possible that at the high temperature-pressure conditions experienced by inserts during cutting processes, where temperatures of 1000° C. are not uncommon, and various mechanisms such as slip, twinning, grain boundary sliding and possibly diffusional creep come into play in α-$Al_2O_3$ and this allows sufficient ductility to prevent brittle failure. See "Nanoindentation Hardness, Microstructure and Wear Resistance of CVD α-Alumina and κ-Alumina Coatings" by Ruppi, Laarsson and Flink.

The growth process, the structure and properties of the deposited layer are governed by deposition conditions such as the nature and temperature of the substrate and the contents and kinetic energies of the gas flux. The rhombohedral α-alumina phase which is the stable allotrope and the hardest of the various polymorphs is generally achieved at deposition temperatures of 1000-1100° C. See for example, Prengel et al. Surface Coatings Technology, 68-69, 217 (1994), although deposition at 580° C. has been achieved by plasma assisted CVD. See Krylov et al. for example, Appl. Phys. A 80 1657 (2004). By use of an appropriate template (i.e. favorable substrate), specifically Chromia, Andersson achieved α-alumina deposition at temperatures of as low as 280° C. by reactive magnetron sputtering. See Ph.D. thesis, "Controlling the Formation and Stability of Alumina Phases" by Jon Martin Andersson, Linköping Universitet, Institute of Technology, Linköping 2005.

Relatively thick coatings of α-alumina may be deposited using CVD techniques. However, such coatings generally display directed grain growth through the coating thickness, resulting in a columnar microstructure that is somewhat susceptible to crack propagation.

A known technique for avoiding columnar growth in κ-alumina is to periodically interrupt the deposition of the κ-alumina by depositing a thin layer of a different material, after which deposition of κ-alumina may be resumed. TiN is one such material that has been used to interrupt the growth of κ-alumina. See "Microstructure and Deposition Characteristics of κ-$Al_2O_3$" S. Ruppi & A. Larsson Journal de Physique IV France 8 (1999), EuroCVD 12, Part 8 350-355. By periodically introducing a thin layer (0.1 μm to 1 μm) of TiN, the κ-alumina crystal growth can be arrested and a new layer of alumina can be nucleated. The resultant κ-alumina is almost equiaxed and displays significantly better resistance to crack propagation than the columnar microstructure typical of CVD κ-alumina.

Unfortunately, the technique does not provide good results for cutting inserts and the like, since the κ-alumina-TiN layers have relatively poor adhesion, resulting in coating peeling, which may actually result in accelerated wear.

There is thus still a need for thick, high quality, α-alumina coatings that show high ductility and a low tendency to both crack propagation and peeling, and the present invention addresses this need.

SUMMARY OF THE INVENTION

It is an aim of the invention to provide improved cutting tools and inserts for cutting tools by novel substrate-coating combinations. Inserts hereinafter include replaceable inserts or tips or bits for machining metal, cutting heads, solid carbide end mills, and cutting plates that may be brazed to a cartridge.

In accordance with a first aspect of the invention, a ceramic coating for an insert is provided: the ceramic coating being a stratified structure comprising a configuration of sub layers of an oxide material alternating with interfacial layers of a second material having good adhesion with the oxide material. The coating is deposited by chemical vapor deposition. Each subsequently deposited interfacial layer serves to terminate a previously deposited oxide material sub layer and to serve as a surface for deposition of a subsequent oxide material sub layer. The second material of the interfacial layers comprises a solid solution of at least one of the elements of the oxide material layer in a hard material.

Typically, the interfacial layer comprises a solid solution of the oxide material in a hard material selected from the group consisting of TiN, TiC and TiCN.

Preferably, the oxide material is alumina and the second material of the interfacial layer is selected from the group comprising TiAlON, TiAlOC and TiAlCON.

Preferably, the oxide material is $Al_2O_3$ and the interfacial layer is TiAlCON.

Most preferably, the oxide material is α-$Al_2O_3$.

It is a particular feature of preferred coating structures of the invention, that growth of each layer of the oxide material sub layer is arrested by the deposition of the interfacial layer prior to development of a columnar structure.

In accordance with another aspect of the invention, a multilayer coating comprising the ceramic coating of claim 1 and an undercoat layer of a first hard material prior to the ceramic layer.

Typically, the first hard material of the undercoat layer is selected from the group consisting of TiC, TiCN and TiN.

Typically, the undercoat layer has a thickness in the range of 2 μm to 15 μm.

Typically, a bonding layer is provided between the undercoat layer and the stratified structure.

Optionally, the bonding layer comprises one of: (a) a layer of TiOCN; (b) a layer of TiAlOCN; (c) a layer of TiOCN followed by a layer of TiAlOCN, and (d) a sandwich structure comprising a first layer of TiOCN followed by a layer of TiAlOCN followed by a second layer of TiOCN.

Where the first hard material of the undercoat layer comprises TiCN deposited on a substrate of tungsten cemented carbide, preferably a base layer, such as TiN, is deposited onto surface of the substrate prior to deposition of the undercoat layer to prevent decarburization of the substrate surface.

Typically, the base layer has a thickness of between 0.1 μm and 1.5 μm.

The ceramic coating is typically deposited onto a substrate selected from the group consisting of hard metals, cermets, high speed steels and ceramics.

Optionally an outer layer of TiN is provided on the ceramic coating.

Optionally, the outer layer of TiN is selectively removed from rake faces.

In accordance with a second aspect of the invention there is provided: a cutting tool insert comprising a substrate of tungsten cemented carbide and a multilayer coating comprising: (a) a base layer of TiN; (b) an undercoat layer of TiCN; (c) a bonding layer comprising a sandwich structure of TiOCN, TiAlOCN and TiOCN; (d) a ceramic coating having a stratified structure comprising sub layers of $\alpha$-$Al_2O_3$ alternating with interfacial layers of TiAlOCN.

Optionally a further layer of TiN is provided on the outer surface of an insert.

In accordance with a third aspect of the invention, there is provided a bonding layer for aiding the bonding of a CVD layer of $\alpha$-$Al_2O_3$ onto an undercoat layer of a first hard material selected from the group consisting of TiN, TiC and TiCN, wherein the bonding layer is selected from the group comprising: (a) TiOCN; (b) TiAlOCN; (c) a double layer comprising TiOCN followed by TiAlOCN and (d) a sandwich structure of TiOCN, TiAlOCN and TiOCN.

In accordance with the present invention, there is also provided a method of forming a CVD-deposited multilayer ceramic coating over a cutting insert having a substrate, the method comprising:

depositing, over said substrate, alternating layers of an oxide material and an interfacial layer adhered to the oxide material over said substrate, wherein the interfacial layer comprises a solid solution of at least one element of the oxide material in a hard material.

The method may comprise depositing the interfacial layer over an immediately preceding oxide layer prior to development of a columnar structure in said immediately preceding oxide layer.

If desired, deposition of the interfacial layer over an immediately preceding oxide layer serves as a surface for deposition of a subsequent oxide layer.

The method may further comprise:
depositing a base layer over the substrate;
depositing an undercoat layer over the base layer, the undercoat layer comprising a hard material;
depositing a bonding layer over the undercoat layer and below said alternating layers of an oxide material and an interfacial layer.

In accordance with some embodiments of the method:
the base layer comprises TiN;
the undercoat layer is selected from the group consisting of TiC, TiCN and TiN; the bonding layer comprises a sandwich structure of TiOCN, TiAlOCN and TiOCN;
the oxide material comprises $\alpha$-$Al_2O_3$; and
the interfacial layer comprises TiAlCON.
If desired, the method further comprises:
depositing an outer layer of TiN over the multilayer ceramic coating.
Also id desired, he method comprises:
selectively removing said outer layer of TiN from rake faces of the cutting insert.

There is also provided a method of treating a cutting insert having an undercoat layer comprising a hard material, in preparation for subsequent CVD deposition of a layer of $\alpha$-$Al_2O_3$, the method comprising:

forming a bonding layer over the undercoat layer prior to CVD deposition of the $\alpha$-$Al_2O_3$, layer, wherein the bonding layer is one from the group consisting of:
(a) a layer of TiOCN;
(b) a layer of TiAlOCN;
(c) a layer of TiOCN followed by a layer of TiAlOCN; and
(d) a sandwich structure comprising a first layer of TiOCN followed by a layer of TiAlOCN followed by a second layer of TiOCN.

In accordance with some embodiments, the method comprises:
forming a sandwich structure of TiOCN, TiAlOCN and TiOCN.
If desired, the method comprises:
forming said bonding layer by CVD such that said bonding layer has a total thickness of between 0.1 µm and 1.0 µm.

The material referred to herein as TiAlOCN, or TiAlCON is a solid solution of Al and O atoms within TiCN. Likewise, the materials referred to herein as TiAlON and TiAlOC are solid solutions of Al and O atoms within TiN and TiC respectively.

It will be noted that materials described herein as TiN, TiC, TiCN and the like, are not necessarily stoichiometric. Indeed, only where subscripts are provided, such as for $Al_2O_3$, can it be assumed that relative proportions are indicated.

TiOCN relates to a generic family of materials with widely different proportions of oxygen, carbon and nitrogen.

TiAlOCN also relates to a generic family of materials with widely different proportions of oxygen, carbon and nitrogen. Furthermore, the aluminum content may vary considerably. Furthermore, the microstructure of the coating is not fully characterized, and may include second phase inclusions within the crystalline structure or along grain boundaries.

BRIEF DESCRIPTION OF THE FIGURES

For a better understanding of the invention and to show how it may be carried into effect, reference will now be made, purely by way of example, to the accompanying drawings.

With specific reference now to the drawing in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

TABLES

Figure 2:
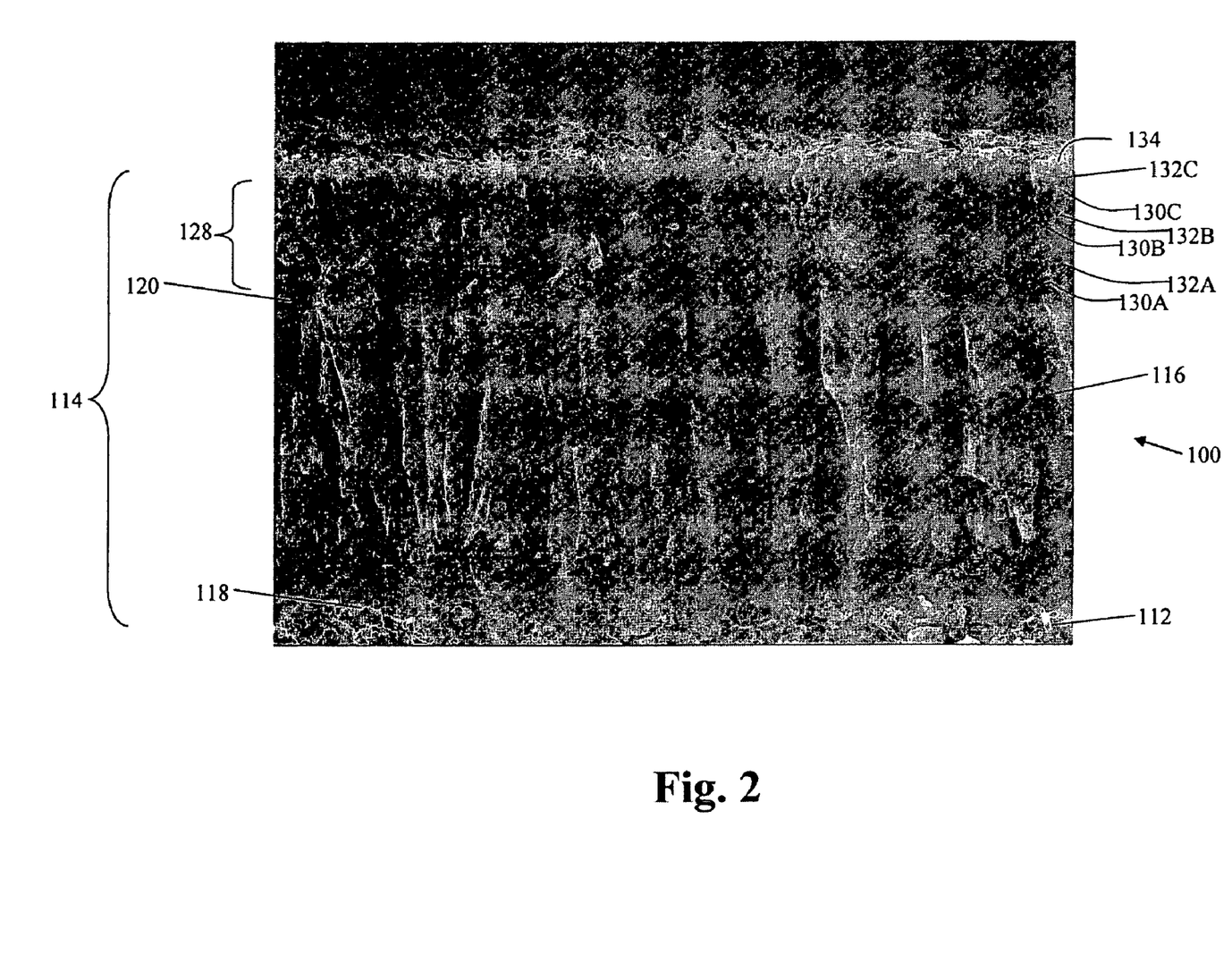
FIG. 2 is an SEM microphotograph showing a cross section through an experimental coating in accordance with the present invention.

Table 1 summarizes the temperature, pressure and gas phase compositions during the deposition of the experimental coating shown in FIG. 2.

DETAILED DESCRIPTION OF THE INVENTION

There are a number of CVD techniques available for depositing $Al_2O_3$ (also known as aluminum oxide, corundum, and alumina).

The vapor typically comprises volatile gases which react chemically on the substrate, depositing $Al_2O_3$; the other products of the reaction being gaseous phase chemicals that are transported away. Using conventional thermal CVD, $Al_2O_3$ requires temperature of over 1000° C. for its deposition. Plasma CVD allows such coatings to be deposited at temperatures below 900° C. In this process, chemical compounds are decomposed and react together using plasma discharge and heating. As a result, very pure alumina films may be generated on the substrate surface. The conventionally used CVD process for $Al_2O_3$ involves the corrosive reactant $AlCl_3$. Using a gas mixture of $AlCl_3/CO_2/H_2$ at low pressure tends to result in columnar growth rather than an equiaxed coating. The gas mixture of $AlCl_3/CO_2/H_2$ at atmospheric pressure may lead to the growth of large grains.

Aluminum tri-isopropoxide is another precursor that may be used to deposit α-alumina. Another route includes the reactive sputtering of aluminum targets in argon-oxygen plasma.

Aluminum acetylacetonate has also been used as the precursor for metal-organic chemical vapor deposition of alumina at atmospheric pressure, see "MOCVD of Aluminum Oxide Barrier Coating" by Jun C. Nable et al. J. Phys. IV France 12 (2002) Pr 4-139.

Aluminum tris-tetramethyl-heptanedionate [Al(thd)3] and aluminum tris-acetylacetonate [Al(acac)3] have also been used for the CVD of $Al_2O_3$ films. See—"Diketonates as Precursors MOCVD of Aluminium Oxide Films Using Aluminium", by A. Devi, S. A. Shivashankar and A. G. Samuelson.

Yet another route is the pyrolysis of aluminum acetylacetonate precursor which may be performed at relatively low temperatures of, say, 435-550° C. to deposit a thin film of alumina.

At high temperatures, grain growth is favored over nucleation and the deposition of α-alumina by CVD processes tend to result in a relatively coarse columnar grain structure characterized by sharp boundaries between adjacent crystals and weak inter-crystalline bonding. Consequently, such α-alumina coatings tend to be susceptible to crack propagation through the coating thickness. Deposition temperature is not the only parameter to affect grain growth and nucleation rates, and other parameters such as the partial pressures of the reactants, substrate temperature, use of $H_2S$ or other catalyst may influence the resultant microstructure and their manipulation provides a means of controlling the features of the coatings thus formed.

A particular feature of the preferred embodiments of the present invention as described hereinbelow is a well bonded, thick, multilayered α-alumina coating having a fine microstructure of equiaxed grains. This is achieved by alternately depositing alumina sub layers or strata and interfacial layers of a second material having good adhesion with the α-alumina sub layer such as, for example, TiAlCON, TiAlON, or TiAlOC, believed to be a solid solution of alumina in TiOCN, TiON, or TiOC respectively. The second layer is deposited by chemical vapor deposition from a mixture of $TiCl_4$, $AlCl_3$, $N_2$, $CH_4$, $H_2$, $CO_2$ and $H_2S$. In this manner, the α-alumina deposition is periodically interrupted by deposition of very thin layers of the second material that both interrupt the α-alumina grain growth of the previous stratum and provide sites for the nucleation of fresh α-alumina crystals in the new stratum and a multilayered α-alumina structure is built up. Thus, the interfacial layer of the second material is formed over an immediately preceding α-alumina oxide layer prior to development of a columnar structure in such immediately preceding α-alumina oxide layer. The development of thick, directed, columnar α-alumina growth is thereby prevented, which significantly reduces susceptibility of the ceramic coating to crack propagation.

Figure 1:
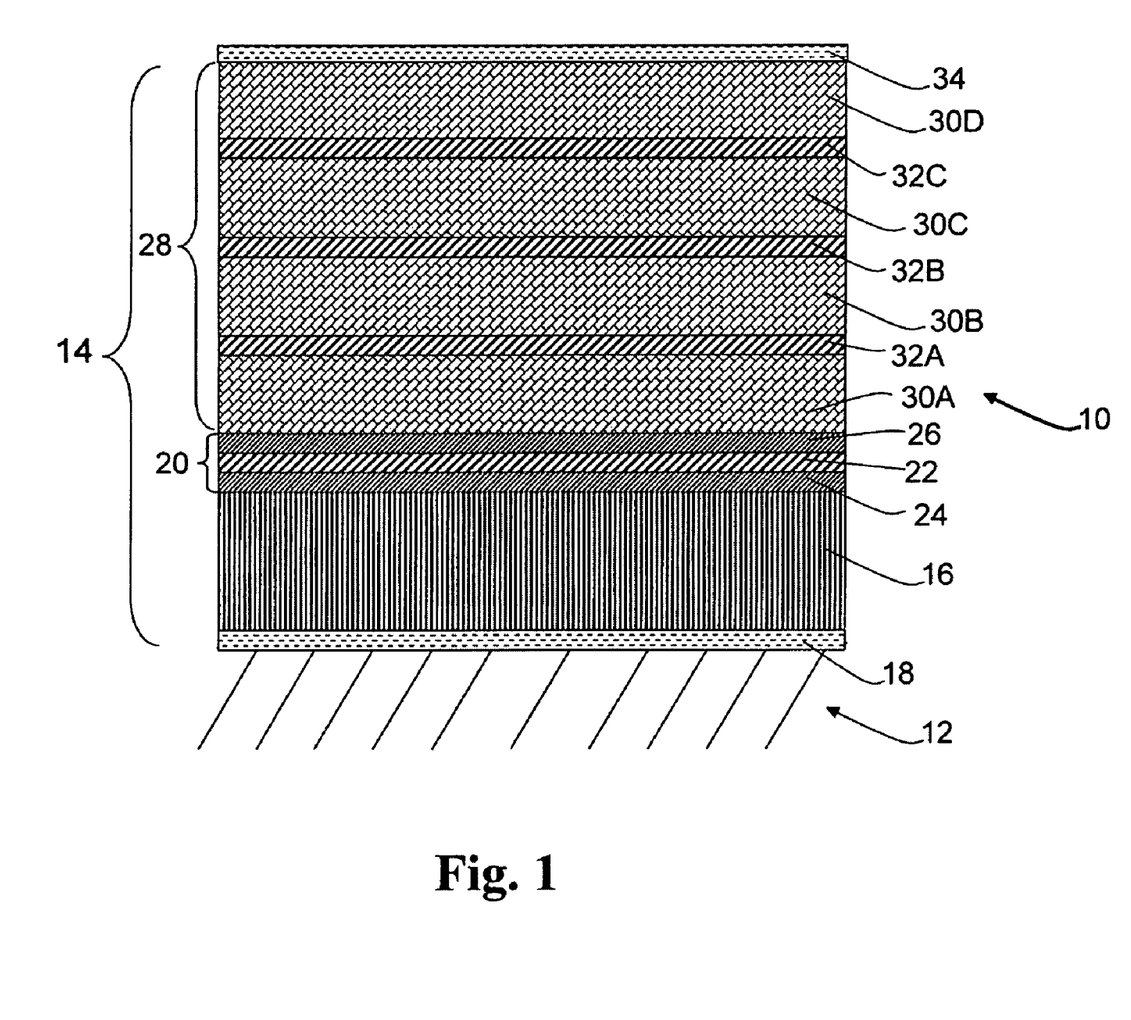
FIG. 1 is a schematic cross-section of the coating layers of an insert in accordance with one embodiment of the invention.
Figure 1A:
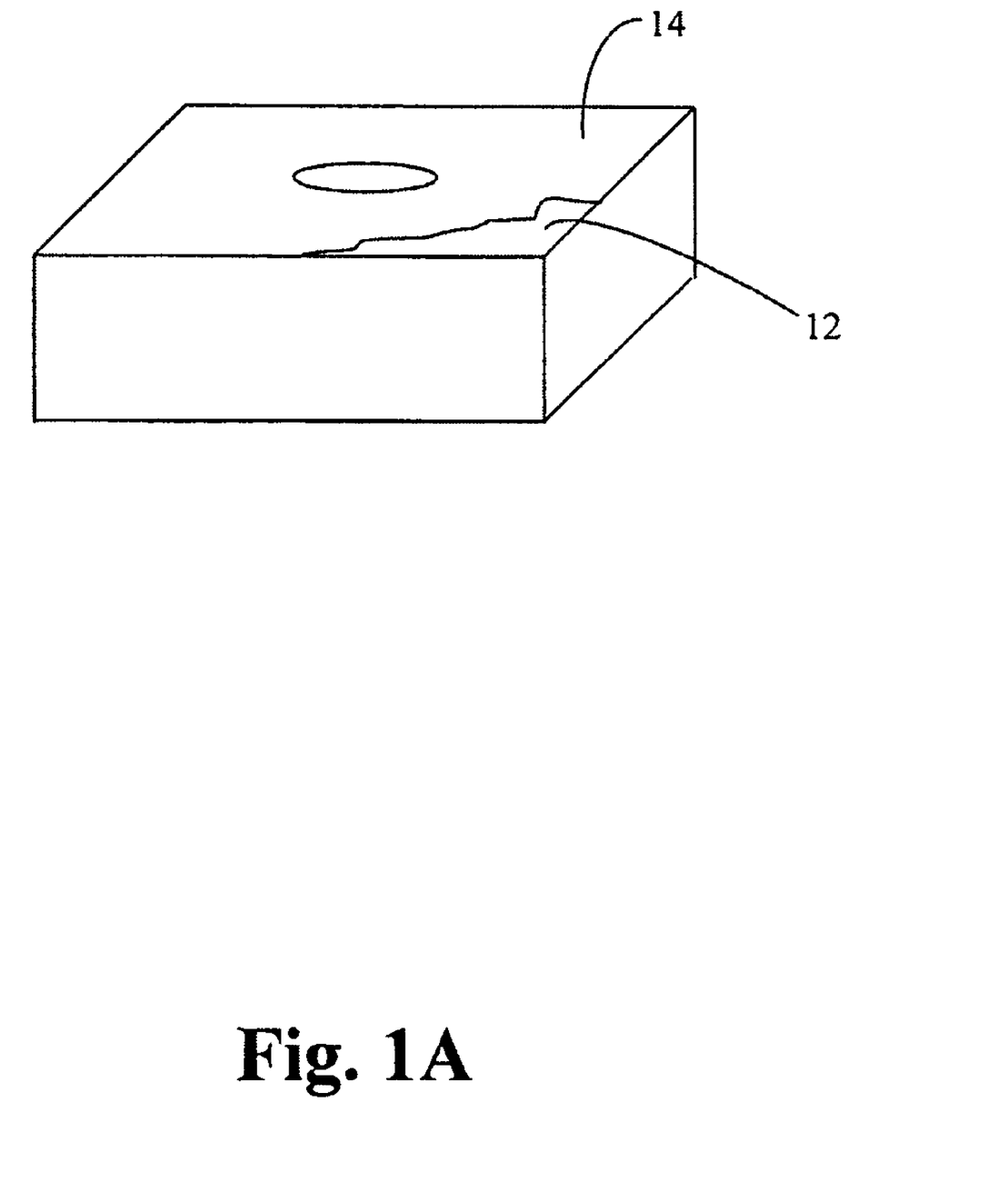
FIG. 1A depicts a coated cutting insert having a generalized shape, the coating being in accordance with the present invention.

Unlike the system described in US20020176755A1 and most other alumina wear resistant coatings, it will be noted that the coating system of the preferred embodiments relate to α-alumina and not to κ-$Al_2O_3$ or γ-$Al_2O_3$. It will be appreciated that, in addition to being the stable allotrope, α-alumina is also the densest allotrope (density of about 4 g/cm as opposed to about 3.6-3.8 g cm/$m^3$ for other allotropes). It has been found that in the pressure-temperature regime encountered during machining operations, the α-alumina proves tougher than the other allotropes, and is able to deform plastically to relieve stress. Additionally, the interfacial layers of the second material have been found to help ensure good interfacial bonding with the alumina, providing high coating integrity. It is believed that the interfacial layer of the second material provides a high density of sites for the nucleation of new $Al_2O_3$ crystals, thereby resulting in a large number of small crystals. It is also believed that the presence of both Al and O in the second material intermediate layers provides chemical bonding to the Al and O in the $Al_2O_3$ and also provides nucleation sites encouraging a large density of alumina grains which encourages the growth of small grains With reference now to FIG. 1, a schematic cross-section of the coating layers of an insert 10 is shown. As seen in FIG. 1A, insert 10 consists of an uncoated body or substrate 12 and a multilayer coating 14. The body 12 may be fabricated from a high speed steel alloy containing, in addition to iron and carbon, varying amounts of refractory metals such as chromium, tungsten, molybdenum and titanium, for example. Alternatively, the body 12 may include a ceramic such as $Si_3N_4$, $Al_2O_3$, $Al_2O_3$/TiC, SiAlON, $Al_2O_3$/SiC whisker composite, and the like. More commonly, the body 12 is a cermet type composite such as TiC or TiN in a metallic binder. However, most commonly, the body 12 is a so-called hard metal cemented carbide type composite material such as tungsten carbide (WC) and additional carbides cemented by a metal matrix, often cobalt (Co) hereinafter referred to as tungsten cemented carbide. Cemented carbides are described on page 321 in *Tungsten Properties, Chemistry, Technology of the Element, Alloys, and Chemical Compounds*, published by Kluwer Academic/Plenum Publishers in 1999, which is incorporated herein by reference. The uncoated body 12 may be any of the aforementioned known compositions and will be referred to hereinafter as the substrate 12.

Typically the substrate 12 will be prepared by degreasing, sandblasting and cleaning in an ultrasonic bath prior to deposition of the multilayer coating 14 thereupon.

The multilayer coating 14 comprises a relatively thick undercoat layer 16 of a first hard material. Undercoat layer 16 is typically 4 μm to 15 μm thick and is particularly good at resisting flank and nose wear. A thin (0.1 μm to 1.5 μm) optional base layer 18, typically TiN, is generally deposited prior to the undercoat layer 16. The base layer 18 allows the insert 10 to be subjected to the relatively severe CVD conditions that may be required for deposition of the undercoat layer 16 without decarburizing the substrate 12 thereof, thereby minimizing the formation of undesirable, brittle η phases ($M_{12}C$, $M_6C$ where M is Co and W) being formed near surface of the substrate 12.

A thin bonding layer 20 (0.1 μm to 1 μm) is deposited on the undercoat layer 16. The bonding layer 20 may be a sandwich structure consisting of an inner bonding layer of TiAlOCN 22 sandwiched between a bottom bonding layer and a top bonding layer of TiOCN, 24, 26 respectively.

TiCON may be deposited by a number of routes. For example: $TiCl_4+N_2+H_2+CH_4+CO_2 \rightarrow TiCON+Chlorides$ and other gases.

TiAlCON may also be deposited by a number of routes. For example: $TiCl_4+N_2+H_2+CH_4+CO_2+AlCl_3 \rightarrow TiAlCON+$ Chlorides and other gases.

A thick ceramic coating 28 is deposited on the bonding layer 20. The ceramic coating 28 has a stratified structure of oxide layers 30 of $\alpha$-$Al_2O_3$ with interfacial layers 32. Firstly, a first oxide layer 30A is deposited. It is believed that due to the top bonding layer 26 of TiOCN the oxide layer 30A is deposited with a high grain density and thus small grain size, and is well bonded to the bonding layer 20.

The interfacial layer 32 is a second material that is a solid solution of oxygen and aluminum in a matrix of TiCN, TiC or TiN. It is hypothesized that excellent bonding of the oxide layer 30 with the interfacial layer 32 results from the interaction between the Al and O in the interfacial layer 32 and the oxide layer 30 by the interfacial layer 32 providing a more appropriate lattice spacing, and more compatible chemical bonding possibilities for nucleation of the oxide layer 30 thereupon.

If allowed to grow unhindered, the oxide layer 30 grains are typically large and columnar. In some cases they may also have a preferred orientation. However, in the present embodiment, a very thin first interfacial layer 32A, of TiAlCON, for example, is deposited onto the first oxide layer 30A. First interfacial layer 32A terminates the grain growth of the first oxide layer 30A, and, it is believed, provides fresh sites for nucleation and grain growth on which a second oxide layer 30B may be deposited. A second, very thin interfacial layer 32B may then be deposited thereupon.

By alternating oxide layers 30 with interfacial layers 32, a thick ceramic coating 28 having small equiaxed grain size may be grown by CVD. Each interfacial layer 32 arrests the grain growth of previous oxide layer 30 and possibly also provides a high density of sites for the nucleation of fresh ceramic crystals thereupon.

It will be appreciated that an improvement in the hardness and wear resistance of most materials is found with a decrease in grain size due to the Hall-Petch effect. Additionally and more significantly, the continuous renucleation prevents the growth of thick, directed, columnar crystals, and thus significantly reduces the crack propagation susceptibility of the ceramic coating thus formed.

The preferred number of oxide layers 30 and interfacial 32 layers within a ceramic coating 28 depends on design criteria for each specific application. It is believed that to a certain extent, the composition of the interfacial layer 32, particularly, the Al and O content within the solid solution interfacial layer 32, determines the grain size. It will be noted that although the composition of the interfacial layer 32 is affected by the partial pressures of the reactive species, it is not determined thereby in a simple manner, and the concentration of the various elements in the coating will invariably be different from their concentration in the reactive gases.

In a preferred embodiment, the substrate 12 is tungsten cemented carbide and the first hard material of the undercoat layer 16 is TiCN which is particularly good at reducing flank wear and crater wear. To avoid decarburization of the substrate 12 which would otherwise lead to the formation of brittle η phases by the severe processing conditions required to deposit the TiCN undercoat layer 16, a base layer 18 is preferably provided thereunder. TiN has been found to be an appropriate option for the base layer 18 for this purpose and is well established in the art.

The bonding layer 20 is deposited between the TiCN undercoat layer 16 and the ceramic coating 28, which is built up of alternating layers of $\alpha$-$Al_2O_3$ oxide layers 30 and TiAl CON interfacial layers 32 laid down in turn (30A, 32A, 30B, 32B, 30C, 32C . . . ).

Use of TiAlCON for interfacial layers 32A, 32B, 32C . . . promotes nucleation of $\alpha$-$Al_2O_3$ oxide layers 30B, 30C, 30D . . . thereupon. The alternating $\alpha$-$Al_2O_3$ oxide layers 30A, 30B, 30C . . . and the TiAlCON interfacial layers 32A, 32B . . . have been found to have excellent adhesion.

The number of oxide 30 and interfacial 32 layers will vary depending on the thickness of ceramic coating 28 desired. In general, by varying the operating temperature and/or partial pressures of the process gases and the activity of the base layer 18 and specifically, the upper surface thereof, nucleation of oxide 30 may be favored over grain growth and a smaller grain size will result. It is also believed that the $\alpha$-$Al_2O_3$ oxide layers 30A, 30B, 30C are almost fully equiaxed, or at any rate far less directional that the columnar crystalline growth resulting from continuous CVD $\alpha$-$Al_2O_3$ growth.

Usefully, to provide an attractive finish, an outer layer 34 may be deposited onto the coating 14 described hereinabove. TiN may be used for this purpose, thereby providing an attractive gold finish, as known. Optionally the outer layer 34 of TiN may be removed at least one rake face of an insert.

Example 1

By way of proof of concept, with reference to FIG. 2, a SEM microphotograph of a cross section of an insert 100 comprising a substrate 112 and a multilayer coating 114 in accordance with a preferred embodiment of the invention is shown. At the bottom of the image, the substrate 112 of cemented tungsten carbide is shown. The angular crystals of tungsten carbide have a mean grain size of about 1 μm. The multilayer coating 114 comprises a thin base coating of TiN 118 of about 1 μm. On top of the TiN base coating 118, a relatively thick of about 7 μm undercoat of columnar TiCN undercoat layer 116 was deposited. A bonding layer 120 is deposited thereupon. Bonding layer system 120 is actually a sandwich structure of TiOCN, TiAlOCN and TiOCN, but because of the interdiffusion, there is poor contrast and the different sublayers are not resolved in the SEM microphotograph.

A stratified thick ceramic coating 128 of alternating sub layers of $\alpha$-$Al_2O_3$ oxide layers 130A, 130B, and 130C of thickness approx. 1 μm alternating with TiAlOCN interfacial layers 132A, 132B, 132C of thickness approx. 0.1 μm is shown. Thus, a ratio of the thickness of the oxide to the interfacial layer is on the order of 10. This ratio can take on other values, but preferably is between 7 and 15. An outer layer of TiN 134 of thickness approx. 0.5 μm can also be seen.

The temperature, pressure and flow rates of the gases used for the chemical vapor deposition are shown in Table 1. These details provide a full enabling description for producing a preferred embodiment of the invention.

Figure 3:
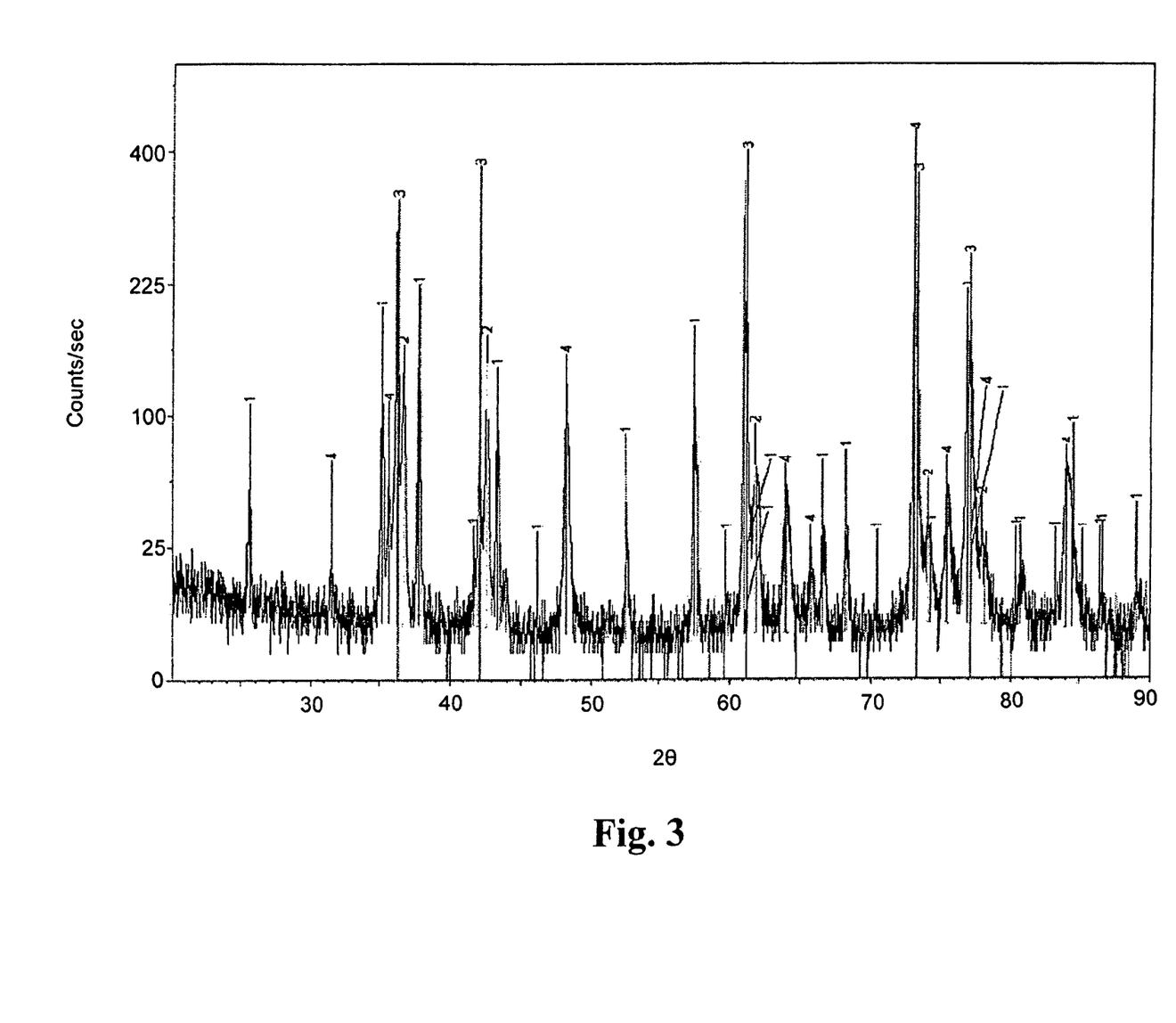
FIG. 3 is an X-Ray diffraction spectrum showing the crystalline phases identified within the coating.

The coating shown in FIG. 2 was examined by X-Ray diffraction (XRD) using X-Rays from a Cu—Kα source. In FIG. 3, the X-Ray Diffraction spectrum is shown. As is well known in the art, the vertical axis is the number of counts per second of photons received by an X-ray detector and the horizontal axis (2θ) is the diffraction angle (at which the detector is set), where θ is the angle of incidence of the X-rays. All the main peaks are labeled as follows: 1 is $\alpha$-$Al_2O_3$; 2 is TiN; 3 is TiCN (MT); and 4 is WC. As is clearly shown, the oxide layers are indeed $\alpha$-$Al_2O_3$ and not other allotropes. Furthermore, from the sharpness of the peaks and the relatively low background noise, it can be seen the coating has only crystalline structure with crystal size more than 100 nm.

TABLE 1

| Step | Duration [min] | Temp [°C] | Pressure [mbar] | $N_2$ [%] | $CH_4$ [%] | $TiCl_4$ [%] | $CH_3CN$ [%] | $CO_2$ [%] | CO [%] | $H_2S$ [%] | HCl [%] | $AlCl_3$ [%] | $H_2$ [%] |
|---|---|---|---|---|---|---|---|---|---|---|---|---|---|
| 1. TiN | 60 | 900 | 160 | 39.0 | | 1.4 | | | | | | | balance |
| 2. TiCN | 140 | 880 | 90 | 24.3 | | 1.8 | 0.8 | | | | | | balance |
| 3. TiOCN | 10 | 880 | 90 | 23.9 | | 1.8 | 0.8 | | 1.6 | | | | balance |
| 4. TiAlOCN | 15 | 980 | 150 | 2.5 | 4.5 | 1.2 | | | 0.6 | | | 2 | balance |
| 5. TiOCN | 5 | 980 | 150 | 2.2 | 4.5 | 0.9 | | | 1.6 | | | | balance |
| 6. $Al_2O_3$ | 10 | 1010 | 65 | | | | | 2.7 | | | 2.2 | 3.9 | balance |
| 7. $Al_2O_3$ | 50 | 1010 | 65 | | | | | 3.5 | | 0.3 | 2.1 | 5.6 | balance |
| 8. TiAlOCN | 15 | 1010 | 160 | 10.4 | 3.8 | 1.1 | | | 1.9 | | | 2.9 | balance |
| 9. $Al_2O_3$ | 10 | 1010 | 65 | | | | | 3.5 | | | 1.9 | 4.8 | balance |
| 10. $Al_2O_3$ | 50 | 1010 | 65 | | | | | 3.5 | | 0.3 | 1.9 | 5.2 | balance |
| 11. TiAlOCN | 15 | 1010 | 160 | 10.4 | 3.8 | 1.1 | | | 1.9 | | | 2.9 | balance |
| 12. $Al_2O_3$ | 10 | 1010 | 65 | | | | | 3.5 | | | 1.9 | 4.8 | balance |
| 13. $Al_2O_3$ | 50 | 1010 | 65 | | | | | 3.5 | | 0.3 | 1.9 | 5.2 | Balance |

Examples 2-4 exemplify the advantages of the Grade A inserts (i.e., inserts that were coated according to the disclosure) which were tested with identical conditions together with Grade B inserts (i.e., inserts coated with a known prior art coating). Details of the Grade B prior art insert coating from the innermost layer to the outer layer is as follows: an innermost TiN layer of thickness approx. 0.6 μm followed by a second thick layer TiCN MT of thickness approx. 6 μm with columnar grains using MTCVD technique. The third layer is TiN of thickness approx. 0.15 μm and the fourth layer is TiC of thickness approx. 0.3 μm. The fifth layer is TiOCN of thickness approx. 0.1 μm and a sixth layer of α-$Al_2O_3$ of thickness approx. 3 μm thick layer. The top outer layer is TiN of thickness approx. 0.8 μm thick.

These examples are summarized in table form.

Example 2

| Operation | milling |
|---|---|
| Material | GG25 |
| Insert type | ADKT1505 |
| Cutting speed | 300 m/min |
| Feed | 0.2 mm/t |
| Number of teeth | 1 |
| Depth of cut | 4 mm |
| Width of cut | 30 mm |
| Coolant | none |

| Results | Tool life (min) |
|---|---|
| Grade A (coating according to invention) | 86.5 |
| Grade B (prior art) | 57 |

Example 3

| Operation | milling |
|---|---|
| Material | GGG50 |
| Insert type | ADKT1505 |
| Cutting speed | 220 m/min |
| Feed | 0.15 mm/t |
| Number of teeth | 1 |
| Depth of cut | 3 mm |
| Width of cut | 30 mm |
| Coolant | none |

| Results | Tool life (min) |
|---|---|
| Grade A (coating according to invention) | 30 |
| Grade B (prior art) | 20 |

Example 4

| Operation | milling |
|---|---|
| Material | SAE4340 |
| Insert type | ADKT1505 |
| Cutting speed | 200 m/min |
| Feed | 0.15 mm/t |
| Number of teeth | 1 |
| Depth of cut | 3 mm |
| Width of cut | 30 mm |
| Coolant | none |

| Results | Tool life (min) |
|---|---|
| Grade A (coating according to invention) | 67.5 |
| Grade B (prior art) | 45 |

Although the material combinations of a preferred embodiment are provided hereinabove, other materials and combinations are possible and further alloying elements may be substituted.

Thus the scope of the present invention is defined by the appended claims and includes both combinations and sub-combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A coated cutting insert comprising a substrate and a CVD-deposited multilayer ceramic coating formed over the substrate, the multilayer ceramic coating comprising:

alternating layers of α-$Al_2O_3$ and an interfacial layer; wherein:

the α-Al$_2$O$_3$ layers and the interfacial layers adhere to one another, with opposite sides of at least one interfacial layer adhering to different α-Al$_2$O$_3$ layers; and the interfacial layer is a solid solution of oxygen and aluminum in a matrix of TiCN, TiC or TiN.

2. The coated cutting insert according to claim 1, wherein the multilayer ceramic coating comprises at least five layers including three layers of α-Al$_2$O$_3$ alternating with two layers of said interfacial layer.

3. The coated cutting insert according to claim 1, wherein: the interfacial layer is selected from the group consisting of TiAlON, TiAlOC and TiAlCON.

4. The coated cutting insert according to claim 3, wherein: the interfacial layer is TiAlCON.

5. The coated cutting insert according to claim 1, wherein: a ratio of a thickness of an α-Al$_2$O$_3$ layer to a thickness of an interfacial layer is between 7 and 15.

6. The coated cutting insert according to claim 1, further comprising:
an undercoat layer between the substrate and the ceramic coating, said undercoat layer comprising a hard material.

7. The coated cutting insert according to claim 6, wherein: the hard material of the undercoat layer is selected from the group consisting of TiC, TiCN and TiN.

8. The coated cutting insert according to claim 7, wherein: said undercoat layer has a thickness in the range of 2 μm to 15 μm.

9. The coated cutting insert according to claim 6, further comprising:
a bonding layer between the undercoat layer and the ceramic coating.

10. The coated cutting insert according to claim 9, wherein: the bonding layer is one from the group consisting of:
(a) a layer of TiOCN;
(b) a layer of TiAlOCN;
(c) a layer of TiOCN followed by a layer of TiAlOCN; and
(d) a sandwich structure comprising a first layer of TiOCN followed by a layer of TiAlOCN followed by a second layer of TiOCN.

11. The coated cutting insert according to claim 9, further comprising:
a base layer between the substrate and the undercoat layer.

12. The coated cutting insert according to claim 11, wherein:
the base layer comprises TiN.

13. The coated cutting insert according to claim 12, wherein:
the base layer has a thickness of between 0.1 μm and 1.5 μm.

14. The coated cutting insert according to claim 11, further comprising:
an outer layer of TiN above the multilayer ceramic coating.

15. The coated cutting insert according to claim 14, wherein:
said outer layer of TiN is absent from rake faces of the cutting insert.

16. The coated cutting insert according to claim 1, further comprising:
a base layer formed over the substrate;
an undercoat layer formed over the base layer, the undercoat layer comprising a hard material; and
a bonding layer formed over the undercoat layer and below the multilayer ceramic coating.

17. The coated cutting insert according to claim 16, further comprising:
an outer layer of TiN formed above the multilayer ceramic coating.

18. The coated cutting insert according to claim 16, wherein:
the base layer comprises TiN;
the undercoat layer is selected from the group consisting of TiC, TiCN and TiN;
the bonding layer comprises a sandwich structure of TiOCN, TiAlOCN and TiOCN; and
the interfacial layer comprises TiAlCON.

19. A method of forming a CVD-deposited multilayer ceramic coating over a cutting insert having a substrate, the method comprising:
depositing, over said substrate, alternating layers of α-Al$_2$O$_3$ and an interfacial layer such that the α-Al$_2$O$_3$ layers and the interfacial layers adhere to one another, with opposite sides of at least one interfacial layer adhering to different α-Al$_2$O$_3$ layers; wherein the interfacial layer is a solid solution of oxygen and aluminum in a matrix of TiCN, TiC or TiN.

20. The method according to claim 19, comprising:
depositing the interfacial layer over an immediately preceding α-Al$_2$O$_3$ layer prior to development of a columnar structure in said immediately preceding α-Al$_2$O$_3$ layer.

21. The method according to claim 19, wherein:
deposition of the interfacial layer over an immediately preceding α-Al$_2$O$_3$ layer serves as a surface for deposition of a subsequent oxide α-Al$_2$O$_3$ layer.

22. The method according to claim 19, further comprising:
depositing a base layer over the substrate;
depositing an undercoat layer over the base layer, the undercoat layer comprising a hard material;
depositing a bonding layer over the undercoat layer and below said alternating layers of α-Al$_2$O$_3$ and an interfacial layer.

23. The method according to claim 22, wherein:
the base layer comprises TiN;
the undercoat layer is selected from the group consisting of TiC, TiCN and TiN;
the bonding layer comprises a sandwich structure of TiOCN, TiAlOCN and TiOCN; and
the interfacial layer comprises TiAlCON.

24. The method according to claim 22, further comprising:
depositing an outer layer of TiN over the multilayer ceramic coating.

25. The method according to claim 24, further comprising:
selectively removing said outer layer of TiN from rake faces of the cutting insert.

* * * * *